United States Patent [19]

Lieu et al.

[11] Patent Number: 4,499,736

[45] Date of Patent: Feb. 19, 1985

[54] DEHUMIDIFIER APPARATUS FOR DISK DRIVES

[75] Inventors: Dennis K. Lieu; Larry Cooper, both of San Jose, Calif.

[73] Assignee: Sperry Corporation, New York, N.Y.

[21] Appl. No.: 559,547

[22] Filed: Dec. 8, 1983

[51] Int. Cl.³ ............................................ F25B 21/02
[52] U.S. Cl. ...................................................... 62/3
[58] Field of Search ............................................ 62/3

[56] References Cited

U.S. PATENT DOCUMENTS

| | | | |
|---|---|---|---|
| 2,779,172 | 1/1957 | Lindenblad | 62/3 |
| 3,212,274 | 10/1965 | Eidus | 62/3 |
| 4,315,599 | 2/1982 | Biancardi | 62/3 X |

Primary Examiner—Lloyd L. King
Attorney, Agent, or Firm—John B. Sowell; Thomas J. Scott; Marshall M. Truex

[57] ABSTRACT

A dehumidifier for a head-disk assembly in a disk drive unit. The dehumidifier includes a housing which is ported to define an air passage therethrough. Within the passage is a Peltier effect device that has a cold surface exposed to air flowing within the passage and a hot surface connected to a heat radiator. Water vapor carried in air that contacts the cold surface condenses; there is sump below the cold surface to contain water that condenses. The housing is installed so that air flow through the passage is induced by convection.

8 Claims, 3 Drawing Figures

DEHUMIDIFIER APPARATUS FOR DISK DRIVES

BACKGROUND OF THE INVENTION

1. Field of the Invention

This invention relates to a dehumidifier and more particularly to a dehumidifier specifically adapted for use within an enclosure in which a head-disk assembly of a disk drive is disposed.

2. Description of the Prior Art

A typical disk drive is housed in a cabinet which contains a head-disk assembly, one or more power supplies, electronic circuit boards, and like components. The head-disk assembly (HDA) is disposed within an enclosure that isolates the HDA from other components in order to exclude airborne particles and like contaminants from the HDA. While active, the HDA enclosure resides at a temperature above that of the ambient temperature within the cabinet, differentials of 10°-40° F. being typical. When a disk drive is deactivated and the air within the HDA enclosure cools, water vapor within the relatively warm air tends to condense. Water on the parts of the HDA can have highly deleterious effects particularly on the magnetic medium.

One expedient employed to reduce or eliminate the adverse effects of moisture in a HDA enclosure upon deactivation is a chemical dehumidifier or desiccant within the enclosure. Such expedient does not eliminate problems in all cases, because the canister must be changed at regular intervals and because the desiccant can be entrained or otherwise carried by the circulating air and react with the media surfaces within the HDA to the detriment of the smoothness and integrity of the media surface.

The Peltier effect and devices exploiting it are well-known. A typical Peltier effect device has a thermocouple junction and conductors for conducting current through the junction. The junction is housed in a module that has two opposing surfaces in heat communication with the respective sides of the junction so that upon passage of current through the junction there will be a temperature differential between the two opposing surfaces of the module. These devices have been employed for heating and/or cooling electrical and other equipment. One source of such modules and related apparatus is Cambridge Thermionic Corporation of Cambridge, Massachusetts, which markets Peltier effect devices and control apparatus therefor under the trademark CAMBION.

SUMMARY OF THE INVENTION

According to the present invention, a Peltier effect module having a hot side and a cold side is employed. The module is installed within a HDA enclosure with the hot side in heat conductor relation to the inner surface of a wall of the enclosure. The outer surface of enclosure communicates with the relatively cold ambient environment. The cold side of the Peltier effect module is disposed in a housing within the HDA enclosure, and the housing is ported so as to induce air flow by convection past the cold side of the Peltier effect module. When the moisture laden air contacts the cold side of the module, the water vapor condenses. The housing defines a sump below the module to receive the water.

An object of the invention is to provide a dehumidifier which functions continuously without replacement of components or other attention by the disk drive system user. This object is achieved by providing apparatus that has no moving parts, consumes a slight amount of power, and has a substantial if not unlimited operating life.

A feature and advantage of Peltier effect modules is that they consume moderate power, e.g. less than five watts, and so can be activated at all times. Contributing to efficient dehumidification is a housing for the Peltier effect module that is ported so as to induce air past the module by convection. More particularly, the housing is elongated in a vertical direction and has an inlet port in the upper region thereof and an outlet port in the lower region thereof so that relatively warm, moisture laden air is induced to enter the inlet port by convection and to exit the outlet port after dehumidification and cooling.

The foregoing, together with other objects, features, and advantages, will be more apparent after referring to the following specification and the accompanying drawing.

DESCRIPTION OF A PREFERRED EMBODIMENT

Figure 1:
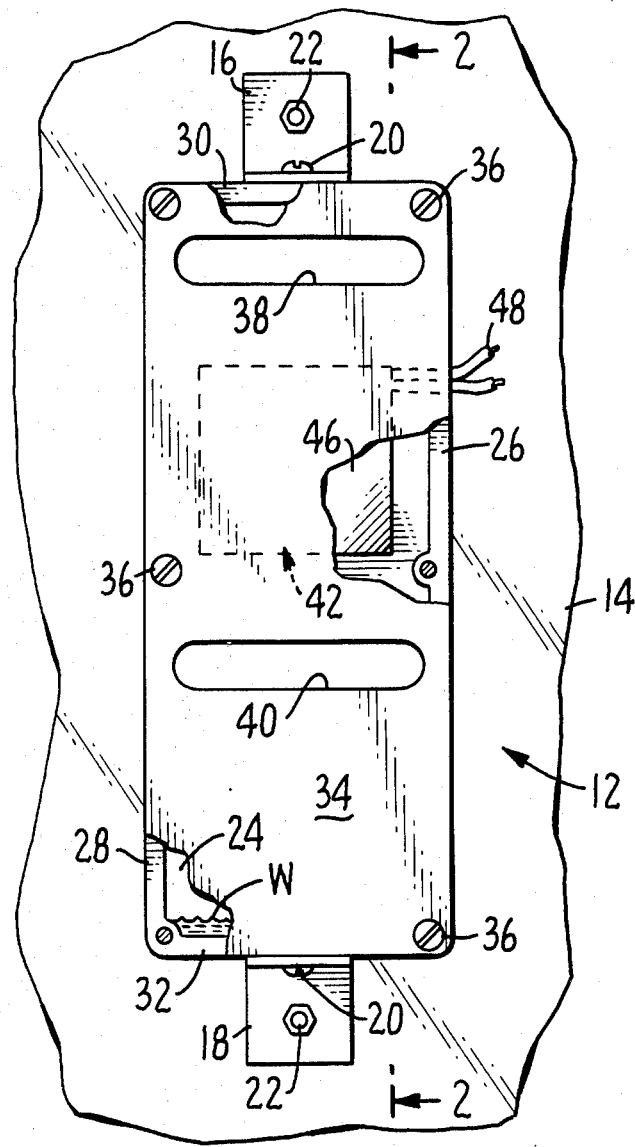
FIG. 1 is an elevation view of dehumidifier apparatus according to the invention viewed from the interior of the HDA enclosure and having portions broken away to reveal certain internal details.

Referring more particularly to the drawing, reference numeral 12 generally indicates a housing for a dehumidifier embodying the present invention. The housing is mounted on the interior surface of a wall of HDA enclosure, a fragment of such wall being shown at 14. Housing 12 is secured to the wall by any suitable means such as an upper angle bracket 16 and a lower angle bracket 18, the brackets each having a horizontal plate fastened to housing 12 by screws 20 and a vertical plate fastened to enclosure wall 14 by bolts 22.

Figure 2:
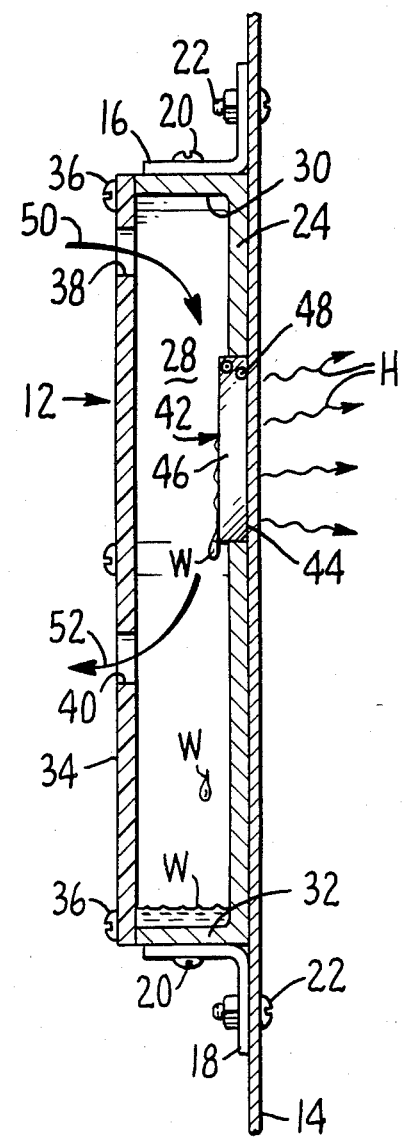
FIG. 2 is a cross-sectional view taken substantially along line 2—2 of FIG. 1.

Housing 12 is preferably constructed of corrosion-proof material having a low heat conductivity characteristics. In one device designed in accordance with the invention, plastic material such as nylon or Delrin is employed. The housing has a rear wall 24, side walls 26 and 28, a top wall 30, and a bottom wall 32. The walls are preferably integral with one another. The side, bottom, and top walls terminate at edges that lie in a common plane that is parallel to and spaced from the rear wall. A cover plate 34 is fixed to the edges of the side, top, and bottom walls by suitable means such as screws 36 so that an enclosed chamber is formed within the device. The chamber defines a vertical passage that has a rectangular cross-sectional shape, equivalent to that shown in FIG. 3. The width of the vertical passage (the distance between the interior surface of side walls 26 and 28) is relatively large compared to the thickness of the passage (the distance between the interior surface or rear wall 24 and cover plate 34). Cover plate 34 adjacent the upper extremity thereof defines an inlet port 38 to the vertical passage which, as can be seen most clearly in FIG. 1, is of horizontally elongated shape. Cover plate 34 also defines an outlet port 40 from the vertical passage which has a shape similar to that of inlet port 38. As seen in FIGS. 1 and 2, outlet port 40 is spaced well above bottom wall 32 and the bottom of the chamber bounded thereby.

Back wall 24 of housing 12 is excised to form an opening corresponding to the shape of a Peltier effect module 42. In the specific embodiment shown in the drawings, module 42 has a generally square shape and the excision in back wall 24 has a corresponding shape. The Peltier effect device is secured within the excision of back wall 24 by a suitable adhesive so that the module is fixed with respect to the back wall and adapted for intimate heat exchange contact with the inner surface of enclosure wall 14. The module has a hot side 44 oriented for intimate contact with the enclosure wall and a cold side 46 exposed to the vertical passage interior of the chamber formed in housing 12. Extending from the module are power conductors indicated at 48; back wall 24 is grooved (not shown) to provide access externally of the housing for circuit connections to the power conductors.

In operation in system in which the HDA enclosure wall is formed of material having good heat conductivity, the device is installed on the internal surface of the enclosure wall of the HDA by forming holes in the enclosure wall for installation of bolts 22. Alternatively the housing can be installed with suitable adhesive. Care is required to assure that the hot side of module 42 is in intimate heat conducting relation to the internal surface of wall 14, and in this connection it may be desirable to coat the hot side of the module with a heat conducting compound or heat sink adhesive before installation is completed. The device is installed in the orientation shown in FIG. 1, in which the inlet port is vertically above the outlet port. Preferably the device is installed within the HDA enclosure as near as possible to the disks and read/write heads associated with the disks. After installation, conductors 48 are connected to a power source, preferable one which is continuously activated whether the disk drive motor and/or head positioning mechanism is activated. In one device designed in accordance with the invention, Peltier effect module 42 is embodied in a device sold under the trademark CAMBION and specified as model number 801-2000-01. Such model number is a single layer Peltier effect device having a power input of about one volt DC at about 3 amps. DC power at such level is readily available within typical disk drive systems.

As the HDA operates, the temperature within the enclosure of which wall 14 is a part typically rises to about 10°-40° F. above the ambient temperature external to the enclosure. The temperature rise is a consequence of heat produced by such components as the disk drive motor and the actuator that effects control of the radial position of the read/write heads with respect to the disk. So long as such elevated temperature subsists at a relatively constant level, there is little condensation because the relatively warm air can carry substantial water vapor without condensing. At times, however, the disk drive is shut down, i.e. de-energized. At these times, heat production by the drive motor and/or read/write head positioning mechanism abates and air within the HDA enclosure cools. Because cool air can carry less water vapor than the relatively warm air, the water vapor tends to condense. The location of inlet port 38 above outlet port 40 induces air to traverse the vertical passage in the chamber, the incoming air traversing a path indicated by arrow 50. The relatively warm air circulates through the chamber past cold surface 46 of Peltier effect module 42. Upon impinging on the cold surface, water vapor within the air condenses as seen at W. The water is gravitationally urged into a sump at the bottom of the chamber, and the now relatively cooler air exits outlet port 40 along a path indicated at 52.

Thus the humidity of the air is reduced so that there is virtually no condensation on the magnetic medium and/or the read/write heads within the HDA enclosure. Because hot side 44 of module 42 is in intimate heat contacting relation to enclose wall 14, the heat developed at the hot side is radiated to the ambient environment, as indicated at H in FIG. 2, so that the temperature at cold side 46 can be maintained at a sufficiently low level to effect condensation. Lower wall 32 can be provided with an opening (not shown) through which the water collected in the sump can drain to some exterior site, although in most cases resumption of operation raises the temperature internally of the HDA enclosure in consequence of which the water will be vaporized and entrained in the air circulating within the enclosure.

Figure 3:
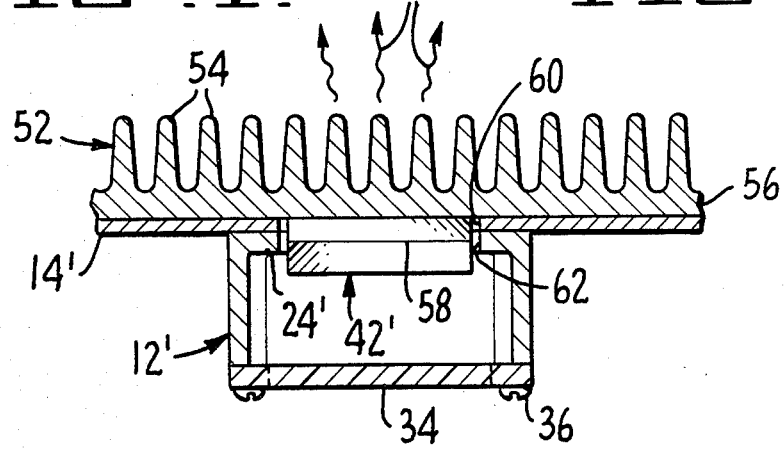
FIG. 3 is a top view of dehumidifier apparatus showing a modification.

In FIG. 3, reference characters that are primed refer to elements that correspond to elements in FIGS. 1 and 2 identified without a prime. There is shown a modification of the invention wherein a heat sink 2 is installed on the exterior surface of enclosure wall 14'. The modification is particularly suitable for systems in which the HDA enclosure wall is formed of material having poor heat conductivity. The heat sink includes a plurality of ribs 54 which extend outward from an integral base plate 56. As is typical, heat sink 52 is constructed of aluminum or like material of good heat conductivity. Secured to the inner surface of base plate 56 of the heat sink is a spacer 58 of like high heat conductivity material. Enclosure wall 14' is excised at 60 to afford access from the interior of the HDA enclosure to the internal surface of the spacer. The hot side of a Peltier effect module 42' is installed in intimate heat contacting relationship to the inner surface of the spacer so that heat from the module is conducted to the ribs of the heat sink for radiation at H' into the ambient atmosphere in which the HDA enclosure is disposed. Rear housing wall 24' has an excision 62 which corresponds in shape to excision 60 in enclosure wall 12' so that the cold side of module 48' is exposed to air flow within the air passage formed in housing 12'.

The operation of the embodiment of FIG. 3 is essentially identical to that described previously except that the dissipation of heat, indicated at arrows H', is somewhat more efficient so that the differential temperature between the hot side and the cold side of the Peltier effect module is enhanced. Although, heat sink is essential in systems where wall 14' is formed of non-heat conducting material, it can be used to advantage in other systems.

Thus it will be seen that the present invention provides a dehumidifier for an HDA enclosure which is efficient, long-lasting, maintenance free, and of insignificant cost to operate. Because of the configuration of ports 38 and 40, their location with respect to one another, and their location with respect to the cold side of the Peltier effect module, the device operates efficiently without the necessity for a fan because air flow due to convection is sufficient to achieve the desired purpose. Although two embodiments have been shown and described, it will be obvious that other adaptations and modifications can be made without departing from the true spirit and scope of the invention.

What is claimed is:

1. Dehumidifying apparatus for a disk drive system having an enclosure including an enclosure wall and a head-disk assembly within the enclosure comprising a substantially impervious housing disposed within said enclosure, said housing defining a chamber and having an inlet port and an outlet port communicating between said enclosure and said chamber to establish an air passage, means for mounting said housing to said enclosure wall interior of said enclosure so that said inlet port is disposed above said outlet port, and a Peltier effect device mounted in said chamber and having power input conductors, said Peltier effect device has a substantially right parallelepiped shape, first and second planar surfaces on said parallelepiped shape, said first surface being a hot surface and said second surface being a cold surface in response to application of power to said conductors, said housing having a rear wall defining an excision substantially similar in shape to Peltier effect device, said Peltier effect device being disposed in said excision for affording contact between said hot surface and said enclosure wall, and said cold surface being exposed to said chamber between said inlet port and said outlet port, so that air traversing said chamber from said inlet port flows past said cold surface and water vapor in the air condenses on said cold surface.

2. Dehumidifying apparatus according to claim 1 wherein said inlet port and said outlet port are configured as horizontally elongate mutually parallel slots.

3. Dehumidifying apparatus according to claim 2 wherein said housing includes a substantially vertical front wall, said slots being formed in said front wall.

4. Apparatus according to claim 1 wherein said housing is formed of material having low heat conductivity.

5. Dehumidifying apparatus according to claim 1 wherein said chamber includes a sump portion below said outlet port for receiving and retaining water condensed onto said cold surface.

6. Dehumidifying apparatus according to claim 1 including a heat sink secured to said enclosure wall exterior of said enclosure, the first surface of said Peltier effect device being in heat conducting contact with said heat sink.

7. Dehumidifying apparatus for a disk drive system having an enclosure including an enclosure wall and a head-disk assembly within the enclosure comprising a substantially impervious housing disposed within said enclosure, said housing defining a chamber and having an inlet port and an outlet port communicating between said enclosure and said chamber to establish an air passage, means for mounting said housing to said enclosure wall interior of said enclosure so that said inlet port is disposed above said outlet port, and a Peltier effect device mounted in said chamber and having first and second spaced apart surface and power input conductors, said first surface being a hot surface and said second surface being a cold surface in response to application of power to said conductors, said hot surface being in heat conducting relation to said enclosure wall and said cold surface being exposed to said chamber between said inlet port and said outlet port so that air traversing said chamber from said inlet port flows past said cold surface and water vapor in the air condenses on said cold surface, said housing including a rear wall, a pair of side walls extending perpendicularly from said rear wall, and top and bottom walls extending perpendicularly from said rear and side walls, said bottom, top, and side walls terminating remote from said rear wall in a plane, a cover plate, and means for securing said cover plate in said plane and forming said chamber in said housing.

8. Dehumidifying apparatus according to claim 7 wherein the width of said passage between said side walls is greater than the thickness of said passage from said back wall to said cover plate, said cold surface having a dimension substantially coextensive with said width so as to enhance contact between air in said passage and said cold surface.

* * * * *